(12) United States Patent
Barsun et al.

(10) Patent No.: US 7,417,864 B2
(45) Date of Patent: Aug. 26, 2008

(54) GEAR DRIVEN SOCKET ACTIVATION MECHANISM

(75) Inventors: Stephan Barsun, Sacramento, CA (US); Kin Tam, Roseville, CA (US); Bryan Bolich, Roseville, CA (US); Matt Neumann, Roseville, CA (US); Richard Augustus Miner, Roseville, CA (US)

(73) Assignee: Hewlett-Packard Development Company, LP., Houston, TX (US)

( * ) Notice: Subject to any disclaimer, the term of this patent is extended or adjusted under 35 U.S.C. 154(b) by 80 days.

(21) Appl. No.: 11/435,903

(22) Filed: May 16, 2006

(65) Prior Publication Data

US 2007/0268672 A1 Nov. 22, 2007

(51) Int. Cl.
*H05K 7/20* (2006.01)
*F28F 7/00* (2006.01)
*H01R 12/00* (2006.01)
*H01R 13/62* (2006.01)

(52) U.S. Cl. .................. 361/719; 165/80.2; 165/80.3; 165/185; 361/704; 361/710; 439/73; 439/342; 439/487

(58) Field of Classification Search ............ None
See application file for complete search history.

(56) References Cited

U.S. PATENT DOCUMENTS

| 5,256,080 | A  * | 10/1993 | Bright ................ 439/342 |
| 5,664,876 | A  * | 9/1997  | Vafai et al. ........... 362/249 |
| 6,219,241 | B1 * | 4/2001  | Jones ................. 361/704 |
| 6,419,514 | B1 * | 7/2002  | Yu .................... 439/342 |
| 6,707,674 | B1   | 3/2004  | Bryant et al. |
| 6,982,875 | B2 * | 1/2006  | Shinotou ............. 361/704 |
| 7,033,200 | B2 * | 4/2006  | Cui et al. ............ 439/342 |
| 2002/0181205 | A1 | 12/2002 | Shia et al. |
| 2003/0048610 | A1 | 3/2003  | Herring et al. |
| 2004/0118584 | A1 | 6/2004  | Franz et al. |
| 2004/0190262 | A1 | 9/2004  | Lai et al. |
| 2005/0099780 | A1 | 5/2005  | Homung |
| 2005/0237720 | A1 | 10/2005 | Li et al. |
| 2005/0281001 | A1 | 12/2005 | Dittus et al. |

* cited by examiner

Primary Examiner—Gregory D Thompson (57) ABSTRACT

A socket activation assembly is configured to close over a component and drive a gear during closure that activates a socket to engage the component.

18 Claims, 8 Drawing Sheets

GEAR DRIVEN SOCKET ACTIVATION MECHANISM

BACKGROUND

Electronic connection sockets can be used to secure electronic packages or integrated circuit devices on a circuit board of a system such as a computer or electronic system. Often sockets are used to facilitate installation and replacement of components such as processors, memory integrated circuits, and other functional elements to various sizes and configurations of sockets. In a typical socket arrangement, for example a zero insertion force (ZIF) or low insertion force (LIF) implementation, a user installs a component into the socket using a tool to activate the socket after a module is placed on a circuit board, such as a motherboard. Usage of the tool can be cumbersome. Socket activation can be forgotten and, because an integrated circuit can make electrical contact without activation of the socket, a module may pass initial factory testing without socket activation. Upon arrival at a customer site, the non-activation of the socket can cause failure of the system to initialize when power is applied, generally incurring the annoyance and expense of warranty replacement.

Some tool-free component retention arrangements may be lever-based compression devices. Often such arrangements may include leaf springs that are relatively stiff and have a limited working range. Therefore tolerance variation in the component or mechanism can adversely affect the force applied to the component. In other arrangements, coil spring and/or screw methods may be used but may require the use of tools and multiple parts, resulting in a cumbersome re-assembly process, for example for replacement of a field replaceable unit.

SUMMARY

In accordance with an embodiment of a retention device, a socket activation assembly is configured to close over a component and drive a gear during closure that activates a socket to engage the component.

BRIEF DESCRIPTION OF THE DRAWINGS

Embodiments of the invention relating to both structure and method of operation may best be understood by referring to the following description and accompanying drawings.

DETAILED DESCRIPTION

A gear-driven socket activation mechanism eliminates tools from an attachment process, ensures socket closure, eliminates a separate socket activation step during construction, and enforces a proper sequence of socket activation and loading.

Some embodiments of a retention device may include a heat sink with pre-attached spring to facilitate heat sink retention, promote uniform component retention forces, and enable multiple attachment schemes, thereby promoting improved module or component reuse.

A gear-driven socket may be used in combination with a structure adapted to retain a component, for example an integrated circuit and/or a heat sink or other electronic or mechanical component. The gear-driven socket and retention structure may use a cam retention mechanism to drive a rotational key that locks a socket such as a socket adapted to engage an integrated circuit, for example a central processing unit (CPU).

Figure 1A:
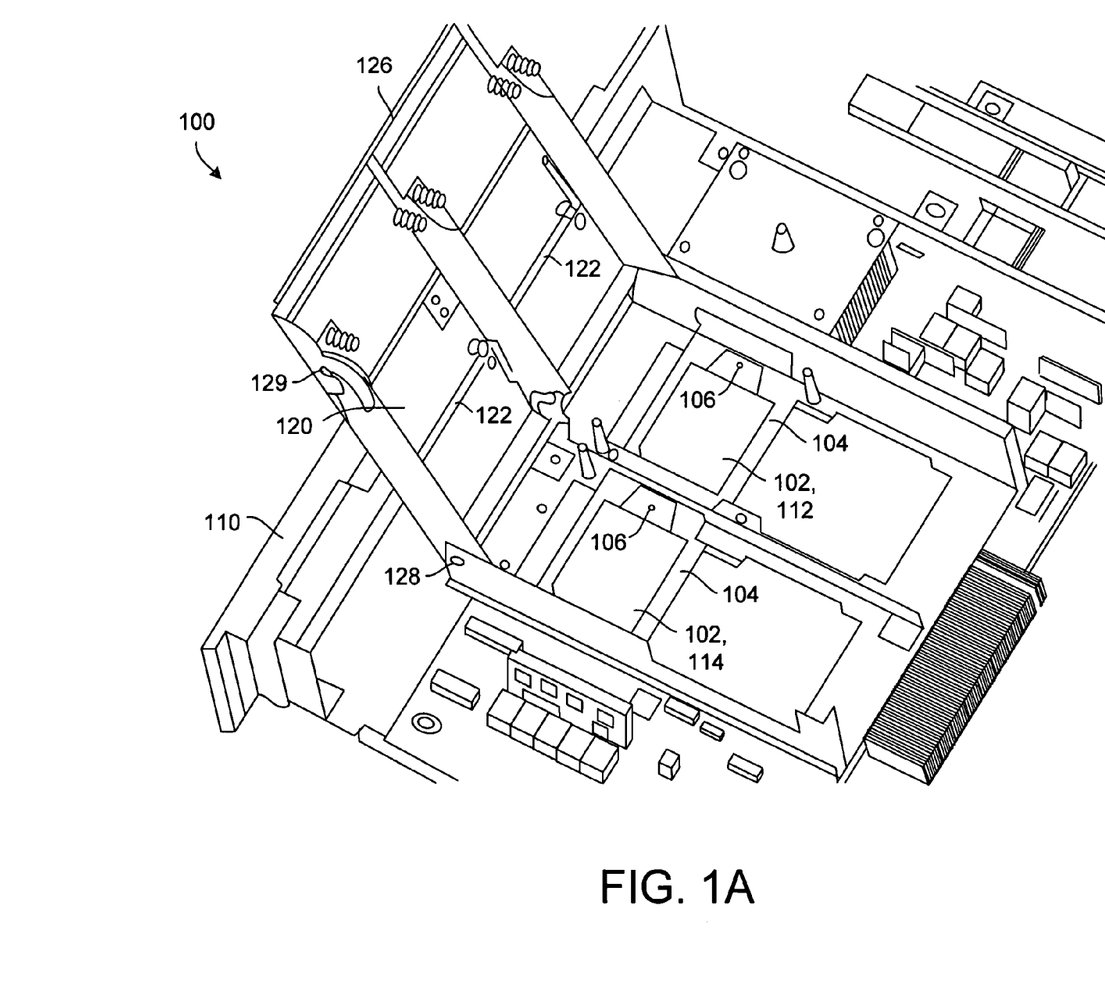
FIGS. 1A through 1C are pictorial diagrams illustrating multiple views of a retention assembly embodiment which activates a socket to engage the component in an automated, tool-less manner during installation.

Referring to FIG. 1A, a pictorial diagram illustrates an overhead perspective view showing an embodiment of a retention assembly 100 which is configured to close over a component 102 and drive a gear during closure that activates a socket 104 to engage the component 102. The retention assembly 100 is shown in an open position in FIG. 1A.

Figure 1B:
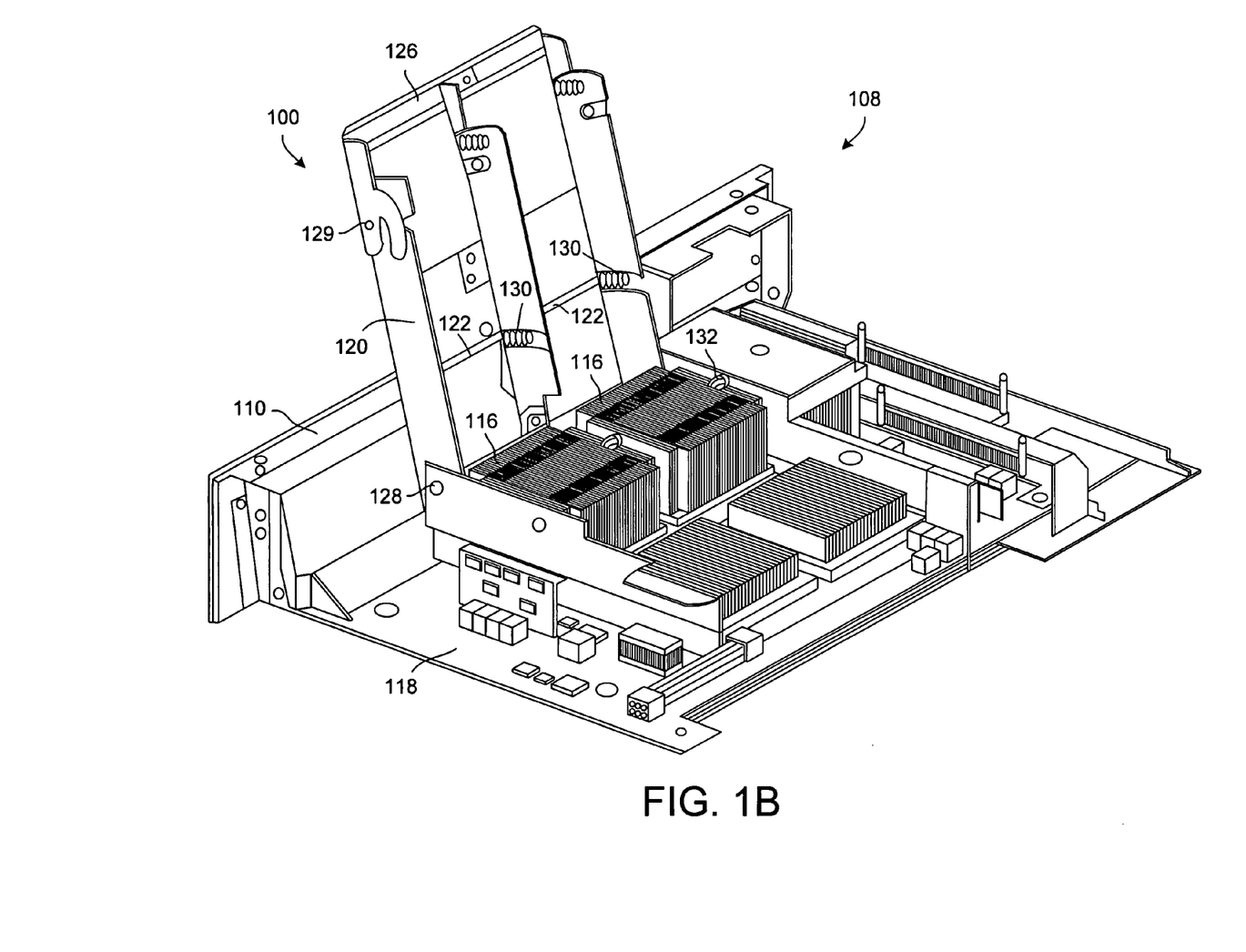

Referring to FIG. 1B, a pictorial diagram illustrates a lateral and overhead perspective view depicting an embodiment of a system 108 which is suitable for incorporating the retention assembly 100. The system 108 may be an information handling system, an electronic system, a computing system, or other system type. The illustrative system 108 can comprise a housing 110, one or more processors 112 adapted to mount in the housing 110, and a memory or other storage 114 for storing data operated upon by the processors 112. The system further comprises one or more heat sinks 116, the sockets 104, and a circuit board 118 configured for mounting the sockets 104. One or more socket activation assemblies 100 can be configured to attach the processor 112 and/or storage 114 to the sockets 104, enabling the sockets 104 to engage and disengage the processor 112 and storage 114. The retention assembly 100 also retains the heat sinks 116 to the processor 112 and the storage 114 against the circuit board 118 with a controlled force.

Figure 1C:
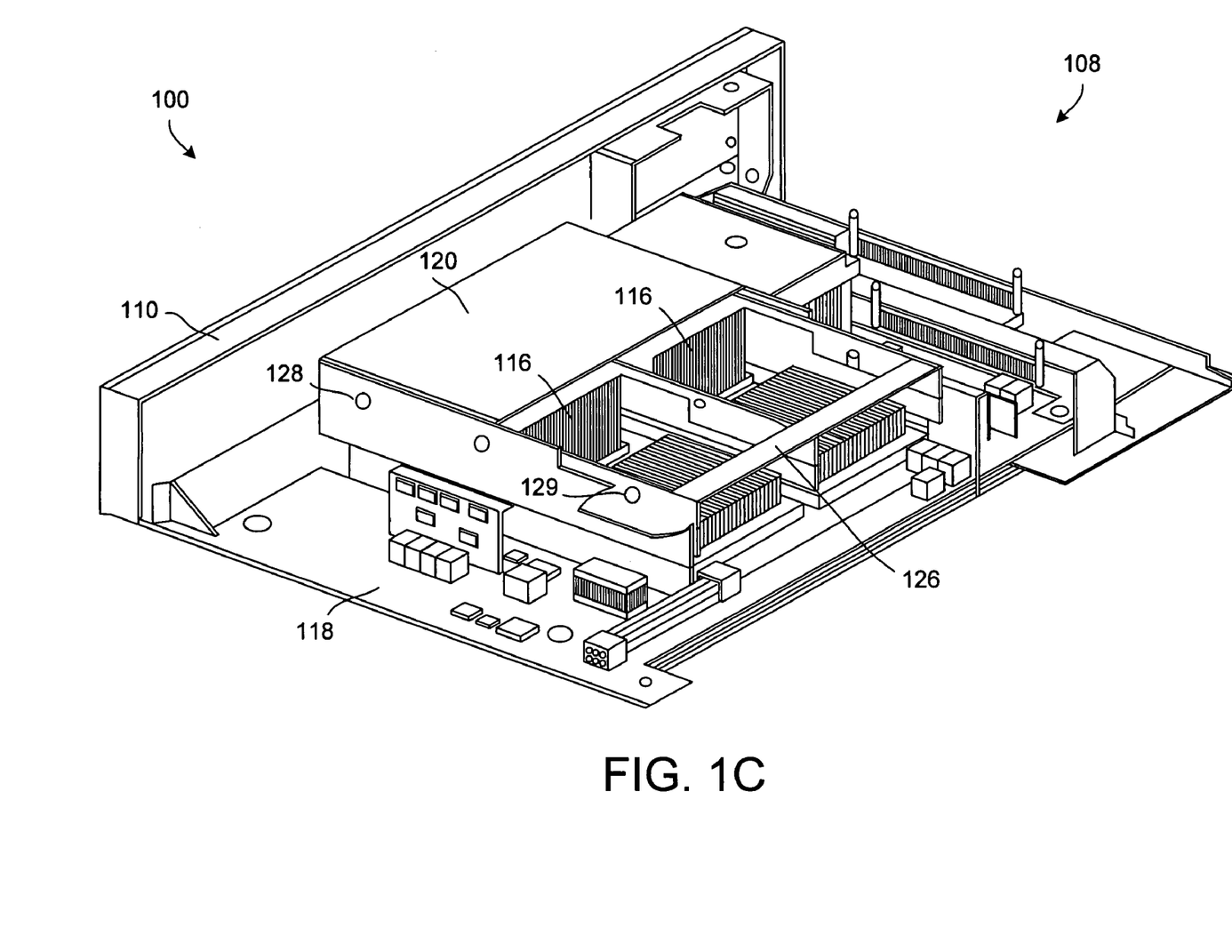

System components can be configured as field replaceable units, for example combining a heat sink with part or all of the retention assembly 100 and various devices and components. FIG. 1B depicts the retention assembly 100 in an open position with central processing unit (CPU) field replaceable units loaded. In a particular embodiment, a field replaceable unit may include an integrated circuit 102, a heat sink 116, and a retention assembly 100. The retention assembly 100 can be configured to attach the field replaceable unit to the circuit board, engaging and disengaging the integrated circuit 102 in the socket 104 and retaining the heat sink 116 to the integrated circuit 102 and the circuit board 118 with a controlled force. FIG. 1C illustrates the retention assembly 100 in a closed position.

FIG. 1B illustrates the open retention assembly 100 including the cam or stiff plate 120 attached to a cam handle 126. A user can grasp the cam handle 126 and rotate the cam 120 about a base pivot point 128 for the cam 120. The use can also manipulate the cam handle 126 to rotate the handle 126 about a handle pivot point 129. Accordingly, the illustrative structure has a first pivot point 128 for the entire stiff plate 120 and a second 129 for the cam handle 126. During module installation, the stiff plate 120 can be rotated about the first pivot point 128 downward to a position where the z-springs 122 touch the top surface of the heat sink 116. The z-springs 122 hold the stiff plate 120 at the cam handle 126 rotates about the second pivot point 129, engaging the gear 132 so that the socket 104 is activated before the stiff plate 120 applies full compression to the heat sink 116. The cam handle 126 locks into a retention position and further compression of the cam handle 126 compresses the entire stiff plate or cam 120, fully compressing the retention assembly 100 against the heat sink 116. Typically, the z-springs 122 are sufficiently stiff that manual compression is difficult with the cam 120 substantially facilitating spring compression.

In another embodiment example, a field replaceable unit can be configured for usage as a computer system comprising a processor 112, a memory 114, and an input/output device 102 in combination with a heat sink 116. The retention assembly 100 can be configured to attach the processor 112 to the socket 104 in a configuration that activates the socket 104 to engage the processor 112 in a motion that closes the retention assembly 100 over the processor 112. The retention assembly 100 deactivates the socket 104 to disengage the processor 112 in a motion that releases the retention assembly 100 from the processor 112.

In some embodiments, the retention assembly 100 can be used to activate a zero insertion force (ZIF) socket or a low insertion force socket although any suitable type of socket may be used.

The integrated circuit socket 104 facilitates mounting of an integrated circuit package 102 to the integrated circuit socket by operation of a key 106 that attaches and detaches the integrated circuit package 102 from the socket 104. One suitable key type is a hexagonal key cam 106 that is rotated to activate and close the socket 104.

Figure 2A:
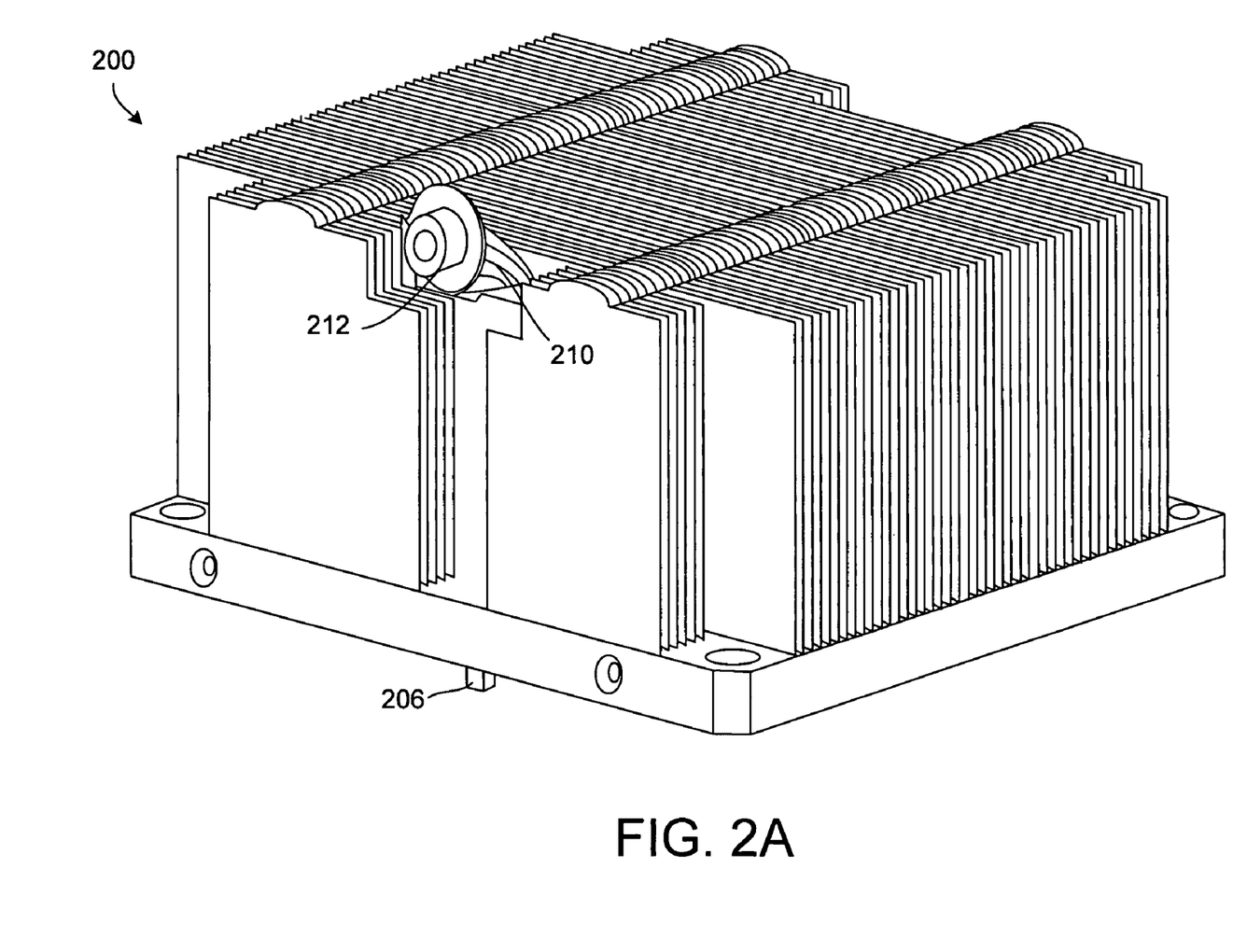
FIGS. 2A and 2B are pictorial diagrams showing a perspective lateral view and an exploded view of an embodiment of a socket activation assembly that can be used as part of the retention assembly shown in FIGS. 1A through 1C.
Figure 2B:
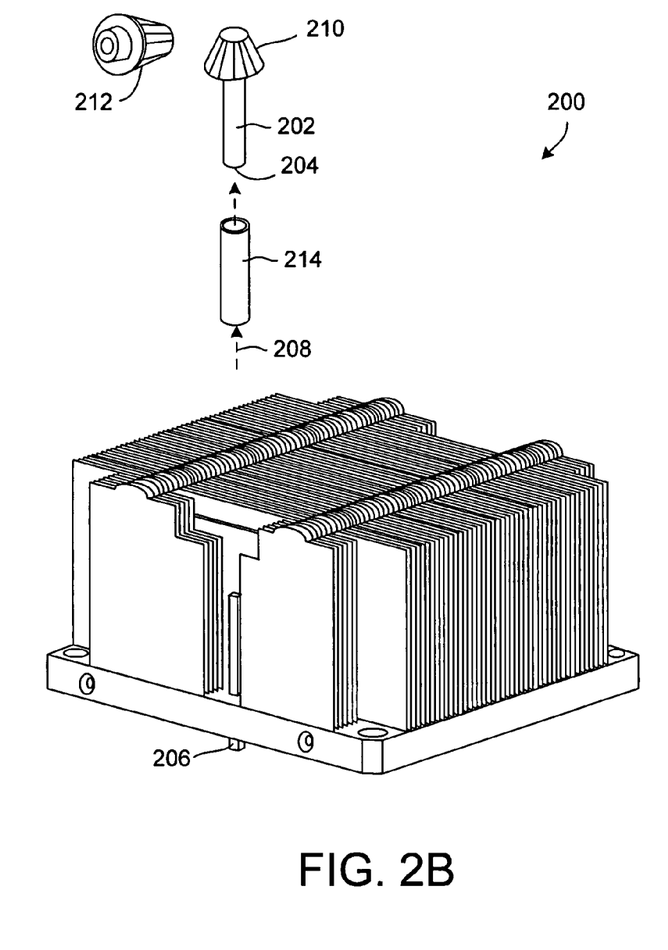

Referring to FIG. 2A, a pictorial diagram shows a perspective lateral view depicting an embodiment of socket activation assembly 200 that is adapted for usage as part of a retention assembly 100 such as the assembly shown in FIGS. 1A through 1C. FIG. 2B is a pictorial diagram showing an exploded view of the socket activation assembly 200. The socket activation assembly 200 is configured to attach the component 102 to the socket 104 and comprises a shaft 202 and a key 204 on an end of the shaft 202 which is configured to engage a socket key 206 that activates and deactivates by rotation of the shaft 202 about a longitudinal shaft axis 208. A first bevel gear 210 is coupled to the shaft 202 and configured to rotate about the longitudinal shaft axis 208. A second bevel gear 212 is configured to engage the first bevel gear 210.

The exploded view shows components of the activation mechanism including the bevel gears 210, 212, the shaft 202, and a shroud 214. The shroud 214 encapsulates and secures the bevel gear mechanism including gears 210, 212, and the shaft 212, and holds the shaft 202 against the key 204 that turns the socket for activation.

A load plate or stiff plate compressed onto the module is configured to turn the bevel gear 212. For example, the load plate may be serrated and mesh with the bevel gear 212 to increase efficiency and reduce or minimize wear on the gear drive. The bevel gear 212 meshes with the bevel gear 210 to turn the key 204, for example a hexagonal key, that turns a socket activation lever.

The illustrative socket activation assembly 200 can be configured as a mechanism that automatically activates a zero insertion force (ZIF) socket via a geared mechanism.

A load plate 120, shown in FIGS. 1A through 1C, is configured to close upon the component 102 and engage the second bevel gear 212 during closure whereby motion during closure rotates the first 210 and second 212 bevel gears, activating the socket 104. The load plate 120 is configured to engage the second bevel gear 212 during opening away from the component 102 so that motion during opening rotates the first 210 and second 212 bevel gears in directions opposite the rotations during closure, thereby deactivating the socket 104.

The load plate or stiff plate 120 can be any part of structure that lowers down onto the heat sink 116. Stiff plate functions to assist in compressing the spring 122 and is depicted in FIGS. 1A through 1C as a relatively large structure to which a cam handle 126 and z-spring 122 are attached. The load plate or stiff plate 120, which can also be called a retention plate, ZIF plate, or cam, is typically a stiffened plate that functions as a cam to strike a gear 132 or lever at one or more points on the circular path of the gear 132 to cause a rotational motion of the gear 132.

A spring 122 coupled to the load plate can be configured to apply a controlled force to retain the component 102 as the load plate 120 is closed over the component 102. In some arrangements, the spring 122 can be a z-load spring such as a wire-form that compresses to load the heat sink 116. In some examples, the z-load spring may be replaced or used in combination with a spring that is pre-attached to the heat sink 116.

The socket activation assembly 200 can be a tool-less assembly that is adapted to retain a heat sink 116 to the socket 104 and to activate and deactivate attachment of a component 102 such as an integrated circuit to the socket 104 without usage of a tool.

In the illustrative example, the retention assembly 100 is shown as an electronic heat sink retention device 100 that may use a cam or stiff plate 120 to compress a Z-spring 122 to apply a controlled force that retains a heat sink 116 or component 102. The stiff plate 120 can have a notch 130 that actuates a gear 132 on the heat sink 116. In some embodiments, the notch 130 may have serrated edges that engage ridges of the gear 132. For example, notches 130 in the load plate 120 can be serrated and function as a rack and pinion with internal gearing.

Referring to FIGS. 2A and 2B in combination with FIG. 1B, the gear 132 includes bevel gears 210, 212. The bevel gear 212 turns another bevel gear 210 that is on the same axis as the socket activation key 206 and turns the key 206. As a result, the socket 104 is activated as the mechanism is closed and opened when the mechanism is opened, elimination a separate installation step to activate the socket 104 and to eliminate the possibility of the socket 104 being left open.

The retention assembly 100 and socket activation assembly 200 ensure socket activation, eliminating the possibility of completing system manufacture with the socket 104 left non-activated. The retention assembly 100 and socket activation assembly 200 enforce the manufacturing sequence of activating the socket 104, then applying retention load during installation. The structures also enforce the reverse sequence when a field replaceable unit is removed.

In some embodiments of computer, electronic, communication, storage, and other systems, the socket activation assembly 200 can be used to attach one or more processors and/or storage devices to sockets 104 and to engage and disengage the processors and/or storage devices in the sockets 104. The socket activation assembly 200 can also couple the one heat sink 116 to the processors and/or storage devices to the circuit board 118 with a controlled force. The socket activation assembly 200 attaches the processor 112 to the socket 104 in a configuration that activates the socket 104 to engage the processor 112 in a motion that closes the load plate 120 over the processor 112. The socket activation assembly 200 deactivates the socket 104 to disengage the processor 112 in a motion that releases the load plate 120 from the processor 112.

During operation, the retention assembly 100 and the socket activation assembly 200 function in combination to handle a component in a system. To install and retain a heat sink 116 onto an integrated circuit 102 for mounting to a circuit board 118, the heat sink 116 is positioned overlying the integrated circuit 102 and the heat sink 116 and integrated circuit 102 are mounted in alignment onto a socket 104. The retention assembly 100 is closed over the heat sink 116 and integrated circuit 102, causing the socket activation assembly 200 to drive a gear in rotation due to the closing motion of the retention assembly 100 and activate the socket 104 due to gear rotation so that the integrated circuit 102 and heat sink 116 are engaged.

To disengage the heat sink 116 and the integrated circuit 102 from the circuit board 118, opening the retention assembly 100 is opened away from the heat sink 116 and the integrated circuit 102 thereby driving the gear in rotation in a direction opposite the rotation of the closing motion. The gear rotation deactivates the socket 104 and disengages the integrated circuit 102 and heat sink 116 from the circuit board 118.

Figure 3A:
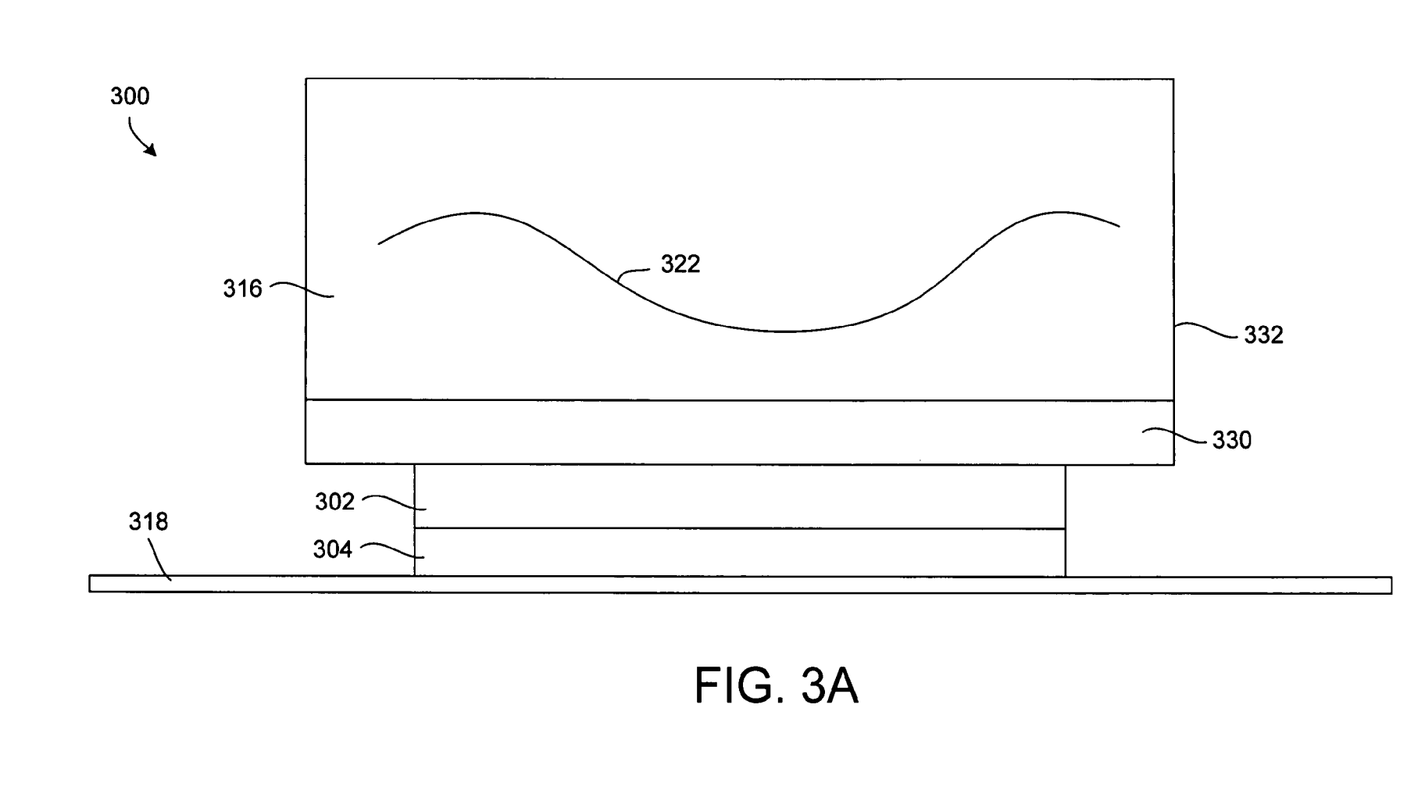
FIGS. 3A through 3C are pictorial diagrams showing side views that depict a heat sink with a pre-attached, pre-compressed spring.

Referring to FIG. 3A, a pictorial side view illustrates an embodiment of a socket activation assembly 300 that includes a pre-attached spring 322 that can be coupled to a heat sink 316 to facilitate installation of the heat sink 316. The socket activation assembly 300 comprises an integrated circuit 302, the heat sink 316, a socket 304, and a circuit board 318 configured for mounting the socket 304. The socket activation assembly 300 attaches the integrated circuit 302 to the socket 304 and engages and disengages the integrated circuit 302 in the socket 304. The socket activation assembly 300 also retains the heat sink 316 to the integrated circuit 302 and the circuit board 318 with a controlled force.

One or more springs 322, for example a leaf spring as illustrated, can be pre-attached to the heat sink 316 and pre-compressed prior to retention of the heat sink 316 to the integrated circuit 302 and the circuit board 318. FIG. 3A shows a spring 322 in an embodiment of a leaf spring which is shown in a free state.

In the illustrative embodiment, the heat sink 316 comprises a heat sink base 330 and multiple heat sink fins 332. One or more attachment features 324, for example rivets or other structures that hold captive and compress the spring 322, can be coupled to heat sink fins 332 and configured to hold the spring 322 to the heat sink 316 in pre-compression to reduce tolerance variation in the force applied to the heat sink 316 and the integrated circuit 302 when the heat sink 316 and the integrated circuit 302 are in retention.

Figure 3B:
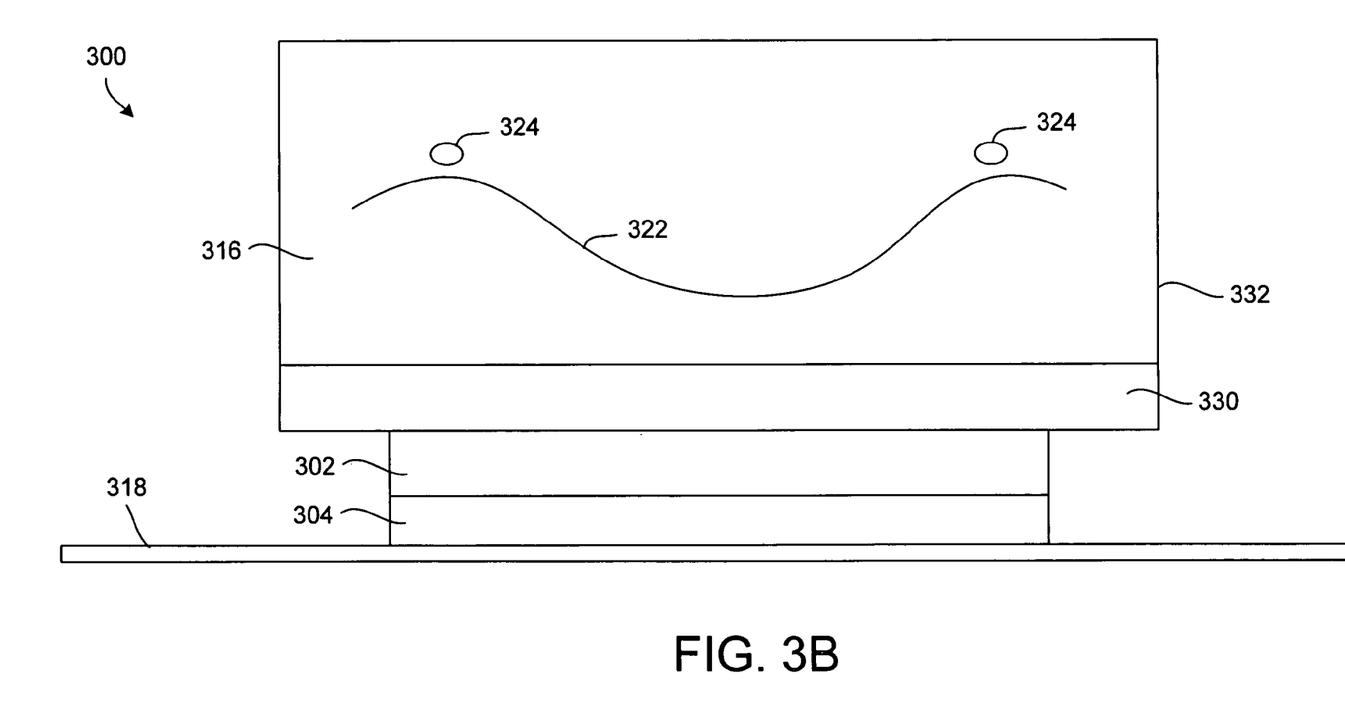

Referring to FIG. 3B, a pictorial diagram shows an embodiment of a heat sink retention assembly 300 comprising one or more springs 322 that can be pre-attached to a heat sink 316 and pre-compressed prior to retention of the heat sink 316 to a circuit board 318.

In some embodiments, the spring 322 can be configured to apply a controlled force to retain the heat sink 316 as a load plate is closed upon the heat sink 316.

The heat sink 316 with pre-attached spring 322 can be used in an electronic heat sink retention device. The spring 322 can be pre-attached to the heat sink 316 and substantially pre-compressed to reduce or minimize the impact of tolerance to the force applied to the heat sink 316 and component 302.

Figure 3C:
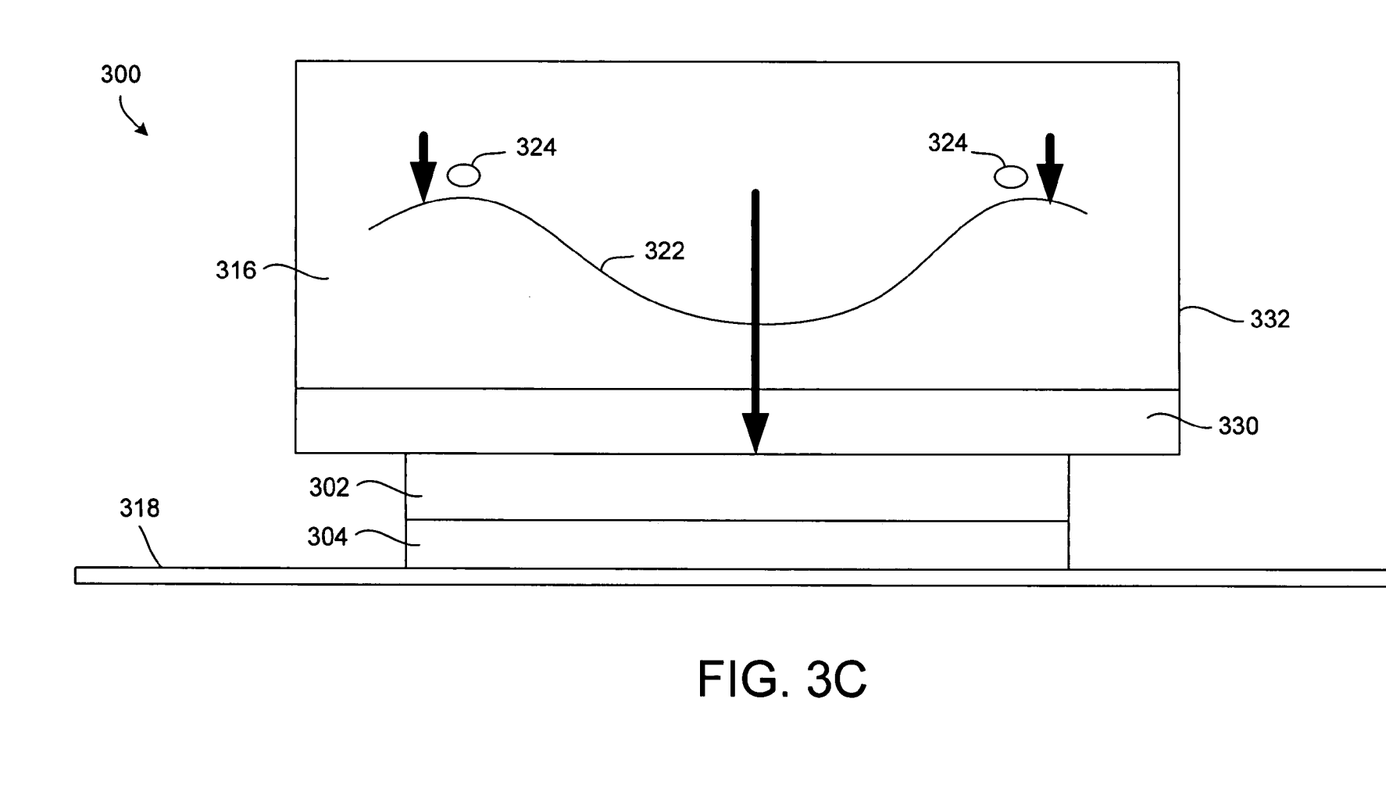

FIG. 3C shows the heat sink retention assembly 300 with a controlled downward deflection of the spring 322 drives a force into the center of the heat sink 316 and then into the socket 304.

FIGS. 3A through 3C depict a particular embodiment in which a pair of leaf springs 322, or other type of spring, coil, wire, or the like, can be attached to the heat sink 316 by compressing the springs 322 with shoulder rivets 324 or other feature types to hold the springs 322 captive. A shoulder screw or cam-and-lever mechanism can be used to further compress the spring 322 to a predetermined position. The shoulder screw can be used in circumstances that space is at a premium. A tool-less cam may be used if more space is available and convenience and efficiency more important than space availability.

The heat sink retention assembly 300 can be used to eliminate tools from the attachment process, control component attachment force through a wider tolerance range, and enables usage of multiple different attachment structures and schemes, facilitating component reuse.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims.

What is claimed is:

1. An apparatus comprising:
   a retention assembly configured to close over a component and drive activation of a socket to engage the component;
   a socket activation assembly adapted to attach the component to the socket on closure of the retention assembly comprising:
   a shaft;
   a key on an end of the shaft configured to engage a socket key that activates and deactivates by rotation of the shaft about a longitudinal shaft axis;
   a first bevel gear coupled to the shaft and configured to rotate about the longitudinal shaft axis;
   a second bevel gear configured to engage the first bevel gear; and
   a load plate configured to close upon the component on closure of the retention assembly and engage the second bevel gear during closure whereby motion during closure rotates the first and second bevel gears, activating the socket.

2. The apparatus according to claim 1 further comprising:
   the load plate configured to open away from the component on opening of the retention assembly and engage the second bevel gear whereby motion during opening rotates the first and second bevel gears in directions opposite the rotations during closure, deactivating the socket.

3. The apparatus according to claim 1 further comprising:
   a spring coupled to the load plate and configured to apply a controlled force to retain the component as the load plate is closed upon the component.

4. The apparatus according to claim 1 wherein:
   the socket activation assembly is a tool-less assembly adapted to retain a heat sink to the socket and to activate and deactivate attachment of the component to the socket without usage of a tool.

5. The apparatus according to claim 1 further comprising:
   the component comprising an integrated circuit;
   a heat sink;
   the socket;
   a circuit board configured for mounting the socket; and
   the socket activation assembly adapted to attach the integrated circuit to the socket and to engage and disengage the integrated circuit in the socket, the socket activation assembly further adapted to retain the heat sink to the integrated circuit and the circuit board with a controlled force.

6. The apparatus according to claim 5 further comprising:
at least one spring pre-attached to the heat sink and pre-compressed prior to retention of the heat sink to the integrated circuit and the circuit board.

7. The apparatus according to claim 6 further comprising:
the heat sink comprising:
a heat sink base;
a plurality of heat sink fins;
at least one attachment feature coupled to at least one of the heat sink fins and configured to hold the at least one spring to the heat sink in pre-compression that reduces tolerance variation to force applied to the heat sink and the integrated circuit in retention.

8. The apparatus according to claim 1 further comprising:
an information handling, electronic and/or computing system comprising:
a housing;
the component comprising a processor adapted for mounting in the housing;
a heat sink;
the socket;
a circuit board configured for mounting the socket; and
the socket activation assembly adapted to attach the processor to the socket and to engage and disengage the processor in the socket, the socket activation assembly further adapted to couple the heat sink to the processor and the circuit board with a controlled force.

9. The apparatus according to claim 1 further comprising:
a computer system comprising:
the component comprising a processor;
memory coupled to the processor;
an input/output device coupled to the processor; and
the socket activation assembly adapted to attach the processor to the socket in a configuration that activates the socket to engage the processor in a motion that closes the load plate over the processor, and deactivates the socket to disengage the processor in a motion that releases the load plate from the processor.

10. The apparatus according to claim 1 further comprising:
the component comprising an integrated circuit;
a heat sink;
the socket;
a circuit board configured for mounting the socket; and
the retention assembly configured to attach the integrated circuit to the socket and to engage and disengage the integrated circuit in the socket, the socket activation assembly further configured to retain the heat sink to the integrated circuit and the circuit board with a controlled force.

11. The apparatus according to claim 1 further comprising:
an information handling, electronic and/or computing system comprising:
a housing;
the component comprising a processor adapted for mounting in the housing;
a storage coupled to the processor;
a heat sink;
a socket;
a circuit board configured for mounting the socket; and
a retention assembly configured to attach the processor to the socket and to engage and disengage the processor in the socket, the retention assembly further configured to retain the heat sink to the processor and the circuit board with a controlled force.

12. The apparatus according to claim 1 further comprising:
a computer system comprising:
the component comprising a processor;
memory coupled to the processor;
an input/output device coupled to the processor; and
the retention assembly configured to attach the processor to the socket in a configuration that activates the socket to engage the processor in a motion that closes the retention assembly over the processor, and deactivates the socket to disengage the processor in a motion that releases the retention assembly from the processor.

13. The apparatus according to claim 1 wherein:
the socket is a zero insertion force (ZIF) socket.

14. An apparatus comprising:
a heat sink retention assembly comprising at least one spring pre-attached to a heat sink and pre-compressed prior to retention of the heat sink to a circuit board;
the heat sink retention assembly adapted to attach a component to a socket comprising:
a shaft;
a key on an end of the shaft configured to engage a socket key that activates and deactivates by rotation of the shaft about a longitudinal shaft axis;
a first bevel gear coupled to the shaft and configured to rotate about the longitudinal shaft axis;
a second bevel gear configured to engage the first bevel gear;
a load plate configured to close upon the component and engage the second bevel gear during closure whereby motion during closure rotates the first and second bevel gears, activating the socket; and
the spring configured to apply a controlled force to retain the heat sink as the load plate is closed upon the heat sink.

15. The apparatus according to claim 14 further comprising:
the heat sink comprising:
a heat sink base;
a plurality of heat sink fins;
at least one attachment feature coupled to at least one of the heat sink fins and configured to hold the at least one spring to the heat sink in pre-compression that reduces tolerance variation to force applied to the heat sink and a component in retention.

16. The apparatus according to claim 14 further comprising:
an information handling, electronic and/or computing system comprising:
a housing;
the component comprising a processor adapted for mounting in the housing;
a storage coupled to the processor;
the heat sink;
the socket;
a circuit board configured for mounting the socket; and
a socket activation assembly configured to attach the processor to the socket and to engage and disengage the processor in the socket, the socket activation assembly further configured to retain the heat sink to the processor and the circuit board with a controlled force.

17. A method for handing a component in a system comprising:

installing and retaining a heat sink onto an integrated circuit for mounting to a circuit board comprising:
   positioning the heat sink overlying the integrated circuit;
   mounting the heat sink and integrated circuit in alignment onto a socket;
   closing a retention assembly over the heat sink and the integrated circuit;
   driving a gear in rotation whereby the closing motion of the retention assembly applies a torque to the gear;
   translating rotation of the gear to rotation of a shaft about a longitudinal shaft axis;
   engaging the shaft to a socket key that activates and deactivates by rotation of the shaft; and
   activating the socket by the gear rotation drive whereby the integrated circuit and heat sink are engaged.

18. The method according to claim 17 further comprising:
   disengaging the heat sink and the integrated circuit from the circuit board comprising:
   opening the retention assembly away from the heat sink and the integrated circuit;
   driving the gear in rotation via the opening motion of the retention assembly in a rotational direction opposite the rotation of the closing motion; and
   deactivating the socket by the gear rotation drive whereby the integrated circuit and heat sink are disengaged.

* * * * *